(12) United States Patent
Bertram et al.

(10) Patent No.: US 7,285,909 B2
(45) Date of Patent: Oct. 23, 2007

(54) ELECTROLUMINESCENT DEVICE WITH A COLOR FILTER

(75) Inventors: Dietrich Bertram, Aachen (DE); Helmut Bechtel, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/518,835

(22) PCT Filed: Jun. 18, 2003

(86) PCT No.: PCT/IB03/02765

§ 371 (c)(1),
(2), (4) Date: Dec. 21, 2004

(87) PCT Pub. No.: WO2004/004024

PCT Pub. Date: Jan. 8, 2004

(65) Prior Publication Data
US 2005/0206310 A1    Sep. 22, 2005

(30) Foreign Application Priority Data
Jun. 28, 2002  (DE) ................... 102 28 938

(51) Int. Cl.
*H05B 33/00*  (2006.01)
(52) U.S. Cl. ...................... 313/506; 313/112
(58) Field of Classification Search ............... 313/506, 313/504, 112; 428/917
See application file for complete search history.

(56) References Cited

U.S. PATENT DOCUMENTS

| 4,744,635 A | | 5/1988 | Takaochi |
| 6,121,726 A | * | 9/2000 | Codama et al. ............ 313/504 |
| 6,641,933 B1 | * | 11/2003 | Yamazaki et al. ......... 428/690 |
| 2001/0019242 A1 | | 9/2001 | Tada |

FOREIGN PATENT DOCUMENTS

| EP | 1 100 129 A2 | 5/2001 |
| JP | 2 34803 | 2/1990 |

OTHER PUBLICATIONS

"Application of Polymer Light-Emitting Materials in Light-Emitting Diodes, Backlights and Displays", by R.J. Visser, Philips Journal of Research, Vo. 51, 1998 pp. 467-477.

* cited by examiner

*Primary Examiner*—Ashok Patel
(74) *Attorney, Agent, or Firm*—Paul Im

(57) ABSTRACT

The invention relates to an electroluminescent device comprising a substrate (1), a porous layer (2) that borders on the substrate (1), a laminated body that borders on the porous layer (2) and that is composed of at least a first electrode (3), an electroluminescent Layer (4) and a second electrode (5), a colored material, preferably an ink, being present at least partially in the pores of the porous layer (2). The porous layer (2) may be segmented and include a plurality of different colored materials, so that a black matrix structure and/or a color filter structure is obtained. The invention also relates to a method of manufacturing an electroluminescent device.

5 Claims, 1 Drawing Sheet

ELECTROLUMINESCENT DEVICE WITH A COLOR FILTER

The invention relates to an electroluminescent device comprising a substrate and a laminated body composed of at least a first electrode, an electroluminescent layer and a second electrode.

Various embodiments of electronically driven display systems based on different principles are known and in widespread use.

In accordance with one of said principles use is made of organic light-emitting diodes, so-termed OLEDs, as the light source. Organic light-emitting diodes are built up of a plurality of function layers. In "Philips Journal of Research, 1998, 51, 467", a description is given of a typical structure of an OLED. A typical structure comprises an ITO (indium tin oxide) layer as the transparent electrode (anode), a conductive polymer layer, an electroluminescent layer, i.e. a layer of a light-emissive material, in particular a light-emissive polymer, and an electrode of a metal, preferably a metal having a low work function, (cathode). Such a structure is usually provided on a substrate, generally glass. The light generated reaches the viewer through the substrate. An OLED comprising a light-emissive polymer in the electroluminescent layer is also referred to as a polyLED or PLED.

To improve the light output or the luminance, an organic LED may comprise further functional layers. Such a LED is described, for example, in U.S. 2001/0019242. A functional layer may comprise, for example, a color filter.

It is an object of the invention to provide an improved electroluminescent device with a high light output having a color filter that can be manufactured in a simple and rapid manner.

This object is achieved by an electroluminescent device comprising a substrate, a porous layer bordering on said substrate, a laminated body that borders on said porous layer and that comprises at least a first electrode, an electroluminescent layer and a second electrode, with a colored material being present at least partially in the pores of the porous layer.

Said porous layer causes the coupling of light out of the electroluminescent device to be improved as said porous layer has a low refractive index and disturbs the total internal reflection. By introducing a colored material into the pores of the porous layer, a color filter is obtained in a simple manner, which color filter changes the emission color of the electroluminescent device and improves the daylight contrast. It is advantageous that the manufacture of the color filter does not require the provision of a further layer.

The advantageous embodiment in accordance with claim 2 enables the absorption properties of the colored material to be adapted to the emission spectrum of the light emitted by the electroluminescent layer.

The advantageous embodiments in accordance with claims 3 through 5 enable an electroluminescent device with a black matrix structure and/or a color filter structure to be obtained in a simple manner.

The advantageous use of an ink as the colored material in accordance with claim 6 enables the colored material to be readily and rapidly introduced into the pores of the porous layer. A further advantage resides in that the colored material can be introduced into the porous layer at a later stage. This is very cost-efficient and, dependent upon the laminated body used, the colored material can be adapted to the (emission) properties of said laminated body.

The invention also relates to a method of manufacturing an electroluminescent device which comprises a substrate, a porous layer that borders on said substrate, a laminated body that borders on said porous layer and that is composed of at least a first electrode, an electroluminescent layer and a second electrode, with a colored material being present at least partially in the pores of the porous layer, said colored material being introduced into the porous layer by means of ink jet printing.

Ink jet printing enables a color filter to be manufactured in a simple, rapid and economic manner. It enables, in particular, an electroluminescent device comprising a black matrix and a pixel-shaped color filter structure to be obtained in a simple and rapid manner.

These and other aspects of the invention will be apparent from and elucidated with reference to two Figures and one example.

Figure 1:
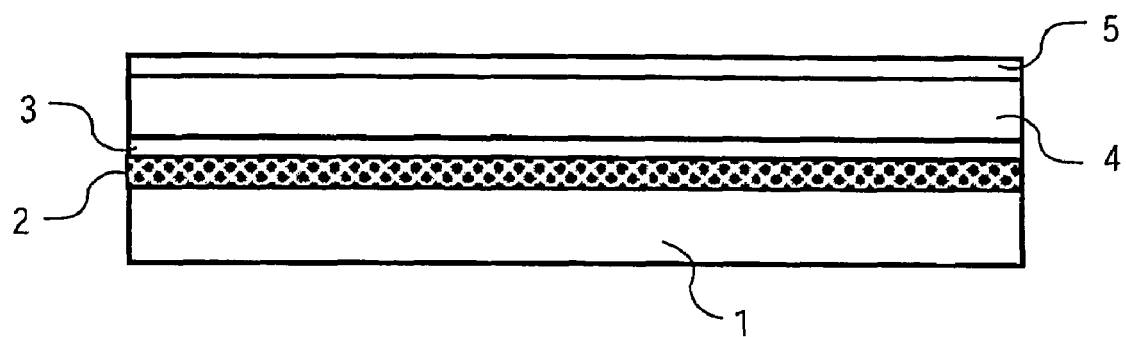
FIG. 1 is a cross-sectional view of an electroluminescent device.

As shown in FIG. 1, an electroluminescent device comprises a substrate 1, which preferably takes the form of a transparent glass plate or a transparent polymer foil. On the substrate 1 there is provided a porous layer 2 that is transparent to the light emitted by the electroluminescent device. Said porous layer 2 has a low refractive index and leads to an improved light output from the electroluminescent device, which can be attributed to the fact that the total internal reflection is disturbed. The layer thickness of the porous layer 2 is preferably in the range between 1 and 10 µm.

The pore size in the porous layer 2 is in the nanometer range, preferably in the range of 20 to 100 nm. The porous layer 2 is preferably a colloidal layer, i.e. it is prepared from colloids or a colloidal solution. Colloids or colloidal solutions are heterogenic material systems containing very, small particles that are invisible under a light microscope, which particles are dispersed in a liquid or gaseous medium. These particles are characterized by a very high surface-to-mass ratio. Consequently, a colloidal layer 2 is composed of the very small particles of a colloidal solution, the size of said particles ranging between 1 nm and 400 µm. Alternatively, the porous layer 2 may contain an aerogel.

A laminated body borders on the porous layer 2, which laminated body comprises at least a first, preferably transparent electrode 3, an electroluminescent layer 4 and a second electrode 5. The first electrode 3 serves as the anode and the second electrode 5 serves as the cathode. The electrodes 3, 5 are provided such that they form a two-dimensional array.

The first electrode 3 may contain, for example, p-doped silicon or indium-doped tin oxide (ITO). The second electrode 5 may contain, for example, a metal such as aluminum, copper, silver or gold, an alloy or n-doped silicon. It may be preferred that the second electrode 5 comprises two or more conductive layers. It may be particularly preferred that the second electrode 5 comprises a first layer of an alkaline earth metal, such as calcium or barium, and a second layer of aluminum.

The electroluminescent layer 4 contains either a light-emitting polymer or small, organic molecules. Dependent upon the type of material used in the electroluminescent layer 4, the devices are referred to as LEPs (Light Emitting Polymers) or polyLEDs or SMOLEDs (Small Molecule Organic Light Emitting Diodes). Preferably, the electroluminescent layer 4 contains a light-emitting polymer. For the light-emitting polymer use can be made, for example, of poly(p-phenylene vinylene) (PPV), a substituted PPV, such as dialkoxy-substituted PPV or a doped PPV.

Alternatively, the laminated body may comprise additional layers such as a hole-transporting layer and/or an electron-transporting layer. A hole-transporting layer is arranged between the first electrode 3 and the electroluminescent layer 4. An electron-transporting layer is situated between the second electrode 5 and the electroluminescent layer 4. Both layers preferably contain conductive polymers.

The electroluminescent layer 4 may be divided into a plurality of color pixels emitting light in the colors red, green and blue. To generate colored light, the material in the electroluminescent layer 4 may be doped with fluorescent dyes, or a polymer emitting colored light is used as the material in the electroluminescent layer 4. In a different embodiment, a polymer is used in the electroluminescent layer 4, which polymer emits light in a broad wavelength range, and a color filter structure in the porous layer 2 is used to generate, from this light, light in any one of the three primary colors red, green or blue.

When a suitable voltage of typically a few volts is applied to the electrodes 3, 5, positive and negative charge carriers are injected that migrate to the electroluminescent layer 4 where they recombine, thereby generating light. This light travels through the first transparent electrode 3, the porous layer 2 and the substrate 1 before reaching the viewer. If the electroluminescent layer 4 is doped with fluorescent dyes, then the light generated by the electron-hole recombination excites the dyes, which in turn emit light in one of the three primary colors.

Figure 2:
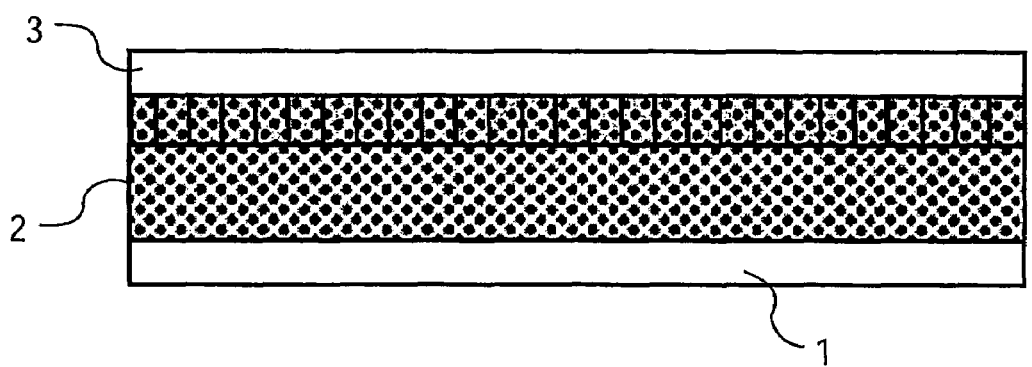
FIG. 2 shows a segmented porous layer with colored material in the pores.

The pores of the porous layer 2 are at least partially provided with a colored material. In this invention the term "colored" includes not only the usual colors red, yellow, green, blue, etc. but also black. If the porous layer 2 contains a colored material then a color filter is obtained. It may be preferred that two or more colored materials are introduced into the pores of the porous layer. Advantageously, as shown in FIG. 2, this results in a division of the porous layer 2 into segments and the formation of a color filter structure. These segments may take the form of, for example, stripes and/or pixels. Preferably, the porous layer 2 comprises stripe-shaped and pixel-shaped segments, and it is particularly preferred that said stripe-shaped segments are formed by a black material and the pixel-shaped segments are formed by red, green or blue materials. In this embodiment, such a segmentation results in a black matrix structure as well as a color filter structure in the porous layer 2. The stripe-shaped segments preferably have a width of 50 to 100 μm. A pixel-shaped segment preferably has a size of 200×300 μm.

It is particularly preferred that the colored material is an ink. A suitable ink usually comprises, in addition to organic solvents, one or more binders, conductive salts as well as, if necessary, further auxiliary agents and additives. Partly these are also used in aqueous form. Suitable inks additionally contain pigments or dyes. For the dyes use can be made of, for example, C.I. Acid Red 118, C.I. Acid Red 254, C.I. Acid green 25, C.I. Acid Blue 113, C.I. acid Blue 185, C.I. Acid Blue 7, C.I. acid blue 7 or C.I. Acid Black 194. For the pigments use can be made of, for example, C.I. Pigment Red 177, C.I. Pigment Red 5, C.I. Pigment Red 12, C.I. Pigment Green 36, C.I. Pigment Blue 209 or C.I. Pigment Blue 16. The quantity of dye or pigment in the ink preferably lies in the range of 0.1 to 20 wt. % with respect to the overall weight of the ink.

To manufacture a porous layer 2 containing one or more colored inks in the pores, use can advantageously be made of ink jet printing. Ink jet printing is a known method by means of which various substrates can be coated in a contact-free manner. Ink jet printing is used, for example, to manufacture color filters in liquid crystal display screens.

First, a substrate 1 is provided, for example by means of a sol-gel process or a spin coating process, with a porous layer 2 of, for example, $SiO_2$ or a metal oxide. If said porous layer 2 is a colloidal layer, for example an aqueous colloidal solution is prepared first, after which said solution is applied to the substrate 1 by means of spin coating. After drying at temperatures in the range of 150 to 180° C., a transparent, porous layer 2 which firmly adheres to the substrate 1 is obtained.

The inks are provided directly onto the porous layer 2, which is possible, for example, because the substrate 1 including the porous layer 2 is present in an ink jet printer. As a result of capillary forces, the ink enters at least partly into the pores of the porous layer 2. In dependence upon the layer thickness of the porous layer 2 and the amount of ink deposited on the porous layer 2 during inl<jet printing, a smaller or greater number of pores of the porous layer 2 will contain ink. Also the accuracy of the printing process is determined by said two factors. Said method has the advantage that a subsequent drying process is superfluous and thus a colored ink can be rapidly and economically introduced as colored material into the pores of the porous layer 2.

If the porous layer 2 should have a black matrix structure and a color filter or a color filter structure, preferably a black ink is provided first, in such a manner that the stripe-shaped segments form a lattice. Subsequently the colored ink(s) is (are) provided.

Dependent on the wavelength of the light emitted by the electroluminescent layer 4 and on the use of the electroluminescent device, the porous layer 2 may contain one, two or three different, colored materials.

Although the description of the invention relates only to a passive electroluminescent device, the invention can also be used in an active electroluminescent device. In an active electroluminescent device the first electrode has a pixel structure and each individual pixel electrode is driven by at least two thin-film transistors and one capacitor.

Next, an embodiment of the invention will be explained that constitutes an example of a possible implementation.

EXAMPLE

An aqueous, colloidal solution of $SiO_2$ having an $SiO_2$ concentration of 5% by weight was prepared by diluting a colloidal solution of $SiO_2$ with a particle diameter of 50 nm (Levasil ©VPAC 4056) using de-ionized water. The aqueous colloidal solution obtained was passed through a membrane filter having a pore size of 5 μm. For the substrate 1 use was made of an 1.1 mm thick glass plate which was clamped in a spin coater and coated with said aqueous, colloidal solution of $SiO_2$. In this process, the substrate 1 was rotated at 200 rpm, and, during said rotation, the solution was dried by means of an infrared lamp. Subsequently, the coated substrate 1 was placed in an oven and exposed to a temperature of 150° C. The porous layer 2 of $SiO_2$, which adhered well to the substrate 1, had a layer thickness of 200 nm.

The coated substrate 1 was introduced into an ink jet printer and, first, black ink was provided on the porous layer 2 in such a manner that a black matrix structure was obtained. Next, red, blue and green inks were successively provided so that a color filter structure was obtained in addition to said black matrix structure. A 100 nm thick layer of ITO was provided as the first electrode 3 onto the porous layer 2 and subsequently structured. Next, in succession, a 200 nm thick layer of polyethylene dioxythiophene (PDOT) as the hole-conducting layer and a 80 nm thick electroluminescent layer 4 were provided. The electroluminescent layer 4 was divided into color pixels emitting light in the colors red, green and blue. The red-emitting color pixels contained poly[{9-ethyl-3,6-bis(2-cyanovinylene)carbazolylene)}alt-co-[2 methoxy-5-(2-ethylhexyloxy)-1,4-phenylene}], the blue-emitting color pixels contained poly[9,9-dihexylfluorenyl-2,7-diyl] and the green-emitting color pixels contained poly[{9,9-dioctyl-2,7-divinylene-fluorenylene}-alt-co-{2-methoxy-5-(2-ethylhexyloxy)-1,4-phenylene}]. The red-emitting color pixels were opposite the areas of the porous layer 2 that contained a red ink in the pores. Likewise, the green-emitting color pixels and the blue-emitting color pixels were opposite the areas of the porous layer 2 containing green ink and blue ink, respectively. The stripe-shaped segments of the porous layer 2 containing black ink divided the pixels into triads, each triad having a red, a green and a blue pixel. On the electroluminescent layer 4 there was provided the second electrode 5 composed of a 5 nm thick layer of Ba and a 200 nm thick layer of Al.

The electroluminescent device obtained exhibited an improved daylight contrast and a high spectral purity of the primary colors.

The invention claimed is:

1. An electroluminescent device comprising a substrate (1), a porous layer (2) that borders on said substrate (1), a laminated body that borders on said porous layer (2) and that comprises at least a first electrode (3), an electroluminescent layer (4) and a second electrode (5), with a colored material being at least partially present in the pores of the porous layer (2), wherein the porous layer (2) is segmented and the segments of the porous layer (2) have different shapes.

2. An electroluminescent device as claimed in claim 1, characterized in that the porous layer (2) contains at least two colored materials.

3. An electroluminescent device as claimed in claim 1, characterized in that the segments of the porous layer (2) take the form of stripes and/or pixels.

4. An electroluminescent device as claimed in claim 1, characterized in that the colored material is an ink.

5. A method of manufacturing an electroluminescent device which comprises a substrate (1), a porous layer (2) that borders on said substrate (1) wherein the porous layer (2) is segmented and the segments of the porous layer (2) have different shapes, a laminated body that borders on said porous layer (2) and that is composed of at least a first electrode (3), an electroluminescent layer (4) and a second electrode (6), with a colored material being at least partially present in the pores of the porous layer (2), characterized in that the colored material is introduced into the porous layer (2) by means of ink jet printing.

* * * * *